United States Patent [19]

Sato

[11] Patent Number: 4,816,887
[45] Date of Patent: Mar. 28, 1989

[54] CMOS GATE ARRAY WITH ORTHAGONAL GATES

[75] Inventor: Shinji Sato, Atsugi, Japan

[73] Assignee: Fujitsu Limited, Kawasaki, Japan

[21] Appl. No.: 8,042

[22] Filed: Jan. 21, 1987

Related U.S. Application Data

[63] Continuation of Ser. No. 628,315, Jul. 6, 1984, abandoned.

[30] Foreign Application Priority Data

Jul. 9, 1983 [JP] Japan .................................. 58-125288
Jul. 9, 1983 [JP] Japan .................................. 58-125289

[51] Int. Cl.[4] ...................... H01L 29/78; H01L 27/04
[52] U.S. Cl. ......................................... 357/42; 357/45
[58] Field of Search ............................... 357/40, 42, 45

[56] References Cited

U.S. PATENT DOCUMENTS

4,412,237  10/1983  Matsumura et al. ................... 357/45
4,513,307  4/1985  Brown .................................... 357/45

FOREIGN PATENT DOCUMENTS

58-64047  4/1983  Japan .
58-97847  6/1983  Japan .
58-139446  8/1983  Japan .................................... 357/42

OTHER PUBLICATIONS

C. Cohen, "Gate Array Needs Fewer Gates for RAM", Electronics International, vol. 56, No. 3, Feb. 1983, pp. 89–90 (?), New York, US.

Primary Examiner—William D. Larkins
Attorney, Agent, or Firm—Staas & Halsey

[57] ABSTRACT

A masterslice semiconductor device comprised of basic cells having additional transistors formed adjacent to the longitudinal end of one or more pairs of transistors which have a configuration almost the same as in the ordinary basic cell. The basic cells are arranged along columns of the semiconductor substrate they are formed in, and constitute a plurality of basic cell arrays. Each of the additional transistors occupies an individual conduction region for the source and drain and is provided with an individual gate electrode which extends to be in line with or perpendicularly to the extension line of the gate of the transistor pair. The additional transistors occupy the space between adjacent basic cell arrays which are, in the prior art masterslice semiconductor device, exclusively used for distributing wiring lines, and accordingly the width of the space is decreased. Because of the versatility of the additional transistors, and the reduced distance between adjacent basic cell arrays, a unit cell can be organized by using the basic cells belonging to adjacent basic cell arrays. The additional transistors are made inactive when the region which they occupy must be exclusively used for distributing interconnecting lines.

26 Claims, 8 Drawing Sheets

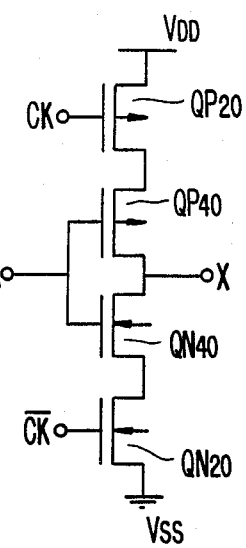
FIG. 13.
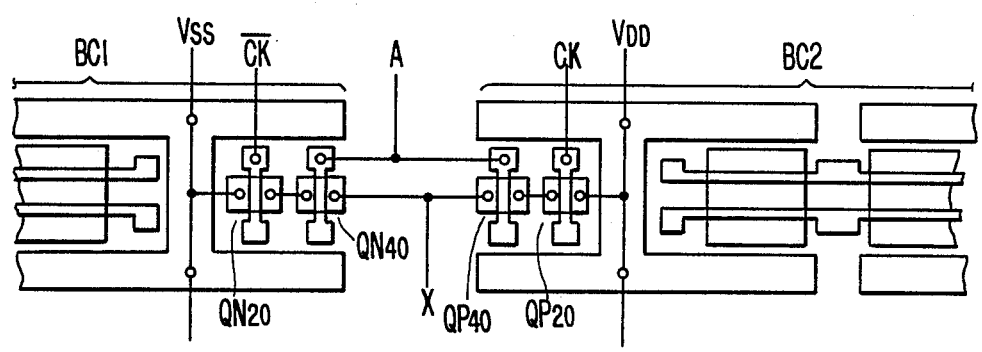
FIG. 14.
FIG. 16.
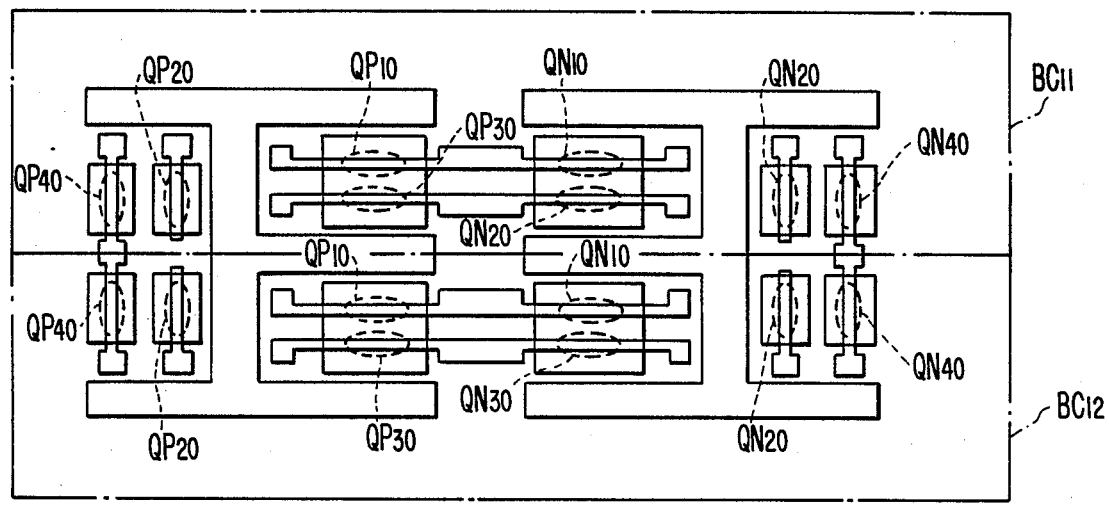

CMOS GATE ARRAY WITH ORTHAGONAL GATES

BACKGROUND OF THE INVENTION

This is a continuation of co-pending application Ser. No. 628,315, filed on July 6, 1984, now abandoned.

The present invention relates to a semiconductor device of a large scale integration (LSI) and, more specifically, relates to the improvement of a so-called masterslice semiconductor device, such as a gate array, fabricated with a large number of transistors arranged along both rows and columns of a semiconductor substrate.

Masterslice semiconductor technology is proposed as a means for providing custom-tailored large scale integrated semiconductor devices at a low cost and within a short turnaround time. That is, a large number of transistors and resistors, which transistors and resistors are formed in a semiconductor chip in advance, are interconnected by the use of masks having wiring patterns necessary for realizing a functional circuit to meet each customer's specific requirements. In the masterslice semiconductor device, the transistors are usually arranged so as to constitute a number of unit groups called basic cells having an identical pattern. An exemplary basic cell configuration and the circuits comprised of the basic cells are disclosed in the U.S. Pat. No. 4,412,237 issued Oct. 25, 1983.

FIG. 1 is a plan view showing an exemplary bulk pattern of a conventional gate array formed by use of the masterslice technology.

As illustrated in FIG. 1, on a semiconductor substrate chip 100, the basic cells BC are arranged along the columns and constitute basic cell arrays $BL_1$, $BL_2$, ... $BL_n$. Each of the basic cells BC is, in general, comprised of at least a pair of p-channel and n-channel transistors. The basic cell arrays are arranged with a specified space therebetween along the rows. At the periphery of the chip 100, there is a pad region which is allotted for a plurality of pads PD, each of which is used as the terminal to the external circuit, and an input/output region which is allotted for the input/output cells IOC, each containing an input/output circuit. As described later, the space between each pair of adjacent basic cell arrays is used for distributing the wiring lines interconnecting the basic cells located in the same basic cell array and/or the basic cells located in other basic cell arrays.

FIG. 2 is an equivalent circuit diagram presenting an exemplary circuit included in a single basic cell of a prior art masterslice semiconductor device. The basic cell is comprised of a couple of p-channel transistors $QP_1$ and $QP_2$ whose sources or drains are connected to each other to form a single common source or drain, and a couple of n-channel transistors $QN_1$ and $QN_2$ whose sources or drains are connected each other to form another single common source or drain. The gates of the p-channel transistor $QP_1$ and n-channel transistor $QN_1$ are connected to each other to form a single common gate, and the gates of the p-channel transistor $QP_2$ and n-channel transistor $QN_2$ are connected to each other to form another single common gate.

FIG. 3 is a plan view illustrating an exemplary bulk pattern of the basic cell for embodying the circuit as shown in FIG. 2. In FIG. 3, the sources and drains of p-channel transistors $QP_1$ and $QP_2$ are formed in the p-type region 1, and the sources and drains of the n-channel transistors are formed in the n-type region 2. The polysilicon gate electrode $3G_1$, which extends to one of the gate channels in each of the p-type region 1 and the n-type region 2, forms a single common gate of the p-channel transistor $QP_1$ and n-channel transistor $QN_1$, while the polysilicon gate electrode $3G_2$, which extends to one of the gate channels in each of the p-type region 1 and n-type region 2, forms a single common gate of the p-channel transistor $QP_2$ and n-channel transistor $QN_2$. 4CP and 4CN respectively designate a p-type contact region and a n-type contact region, which regions are used for keeping respective portions of the semiconductor substrate at respective potentials.

A number of such basic cells as shown in FIGS. 2 and 3 are disposed along the columns of a semiconductor chip, hence forming a plurality of arrays called basic cell arrays. The basic arrays are arranged adjacent one another with a specified space therebetween along the rows of the semiconductor substrate. Such basic cells are interconnected by aluminum layer wiring lines, with which a desired LSI circuit network is completed.

In the masterslice semiconductor device, the LSI circuit network is formed of a number of elementary circuit blocks, in general, including a 2-input NAND gate, 2-input NOR gate and/or flip-flop circuit. Each of the elementary circuits is organized by using a single or a plurality of such basic cells as shown in FIGS. 2 and 3. The area occupied by the basic cells constituting each elementary circuit is referred to as a unit cell.

In the prior art, each such unit cell is comprised of basic cells successively arranged in a basic cell array.

FIG. 4 is a plan view of a partial bulk pattern of unit cells in the basic cell arrays and wiring lines interconnecting the unit cells. In FIG. 4, the unit cell $UC_1$ and $UC_2$, which are a NAND gate and a NOR gate, respectively, are comprised of basic cells in the basic cell arrays $BL_1$, while unit cell $UC_3$, which includes a flip-flop circuit F/F, is comprised of basic cells in the basic cell array $BL_2$. The basic cells in a unit cell are interconnected by use of so-called double-layer aluminum metallization technology. The wiring lines interconnecting the basic cells within a unit cell are permitted to be routed over the relevant basic cells. Interconnection among unit cells is also accomplished by use of the double-layer aluminum metallization technology, however, the wiring lines must be formed in the space between the adjacent basic cell arrays. This limitation is imposed by the performance of the present CAD (Computer Aided Design) system employed for designing the layout of the circuit network on a masterslice semiconductor chip.

These wiring lines formed in the space between adjacent basic cell arrays are assumed to be arranged on a virtual grid having a constant pitch. In FIG. 4, the wiring line interconnecting the NOR gate (unit cell $UC_2$) and the flip-flop circuit in unit cell $UC_3$, for example, consists of the segments indicated by LA and LB, which are laid on the virtual grid situated between two adjacent basic cell arrays $BL_1$ and $BL_2$. The virtual grid is, of course, not apparent in the actual pattern but only exists as a logical image in the process of CAD. If assumed that there are nine grid lines along the longitudinal direction of the basic cell arrays $BL_1$ and $BL_2$, nine wiring lines such as LA can be accommodated in the space. Such space is referred to as a wiring region of nine channels. The same applies as to the grid lines in the transverse direction.

According to the double-layer aluminum metallization as described above, each segment LA extending along the longitudinal direction of the basic cell arrays is fabricated from the first aluminum layer, while each segment LB extending perpendicularly to the longitudinal direction is fabricated from the second aluminum layer, in general. The segments LA and LB are connected to each other at each crossover point marked with the doubled circle, via a throughhole formed in the insulating layer therebetween. Thus, the interconnection between the unit cells in the adjacent basic cell arrays is completed.

As mentioned before, in the prior art masterslice technology, the basic cells constituting a unit cell must be selected from those belonging to the same basic cell array. This is, a unit cell must be one-dimensional in terms of the arrangement of the basic cells. This is mainly due to the performance of the present CAD system employed for the design of a circuit network in the masterslice semiconductor device. To manufacture a final masterslice semiconductor device within a required short turnaround time, it is necessary to minimize the design parameters which are defined in the CAD system, and the one-dimensional unit cell is a requirement for the prior art masterslice technology. Thus, a unit cell is organized in a basic cell array, and interconnections between adjacent basic cell arrays are conducted on a unit cell basis, and not on a basic cell basis.

As the result of the restriction that a unit cell must be one-dimensional in the sense mentioned above, the wiring lines including those for interconnecting basic cells in a unit cell and those for interconnecting the unit cells become long, and, further, the variety and the scale of the unit cell are limited by the number of the channels available in the space between adjacent basic cell arrays. As the wiring lines becomes longer, the propagation delay of the signals in a circuit network formed in the masterslice semiconductor device is increased. Such propagation delay requires a countermeasure such as implementation of block buffer circuits. The block buffer circuit commits a number of transistors, for example, eleven transistors for each block buffer circuit, to provide its high driving power enough for compensating the propagation delay.

Furthermore, in the masterslice semiconductor device comprised of basic cells as shown in FIGS. 2 and 3, some kinds of unit cells, such as a RAM (Random Access Memory) cell, a transmission gate circuit and a clocked gate circuit, cannot be formed without leaving one or more redundant transistors in some basic cells constituting the unit cell. For example, four of the basic cells as shown in FIG. 3 are used to constitute a single 8-transistor RAM cell, however, only half of the total of 16 transistors in the four basic cells are utilized in the RAM cell and the other half of the transistors are made inactive. A similar situation applies for a transmission gate circuit. That is, two transmission gates can be formed from each of the basic cells, but they cannot operate independently of each other; accordingly, except for some special applications, one of the two transmission gates is redundant. In a clocked gate circuit comprised of pairs of the basic cells, a half of the total of eight transistors is unused and made inactive. The redundant transistors reduce the integration density of the LSI circuit network on the masterslice semiconductor chip.

If it is possible to constitute a unit cell beyond the space between the adjacent basic cell arrays, that is, if the unit cell is two-dimensional in terms of the arrangement of the basic cells, the above inconveniences in the prior art unit cell configuration can be avoided and the freedom in the circuit design on a masterslice semiconductor device can be substantially increased.

SUMMARY OF THE INVENTION

It is, therefore, the primary object of the present invention to provide a masterslice semiconductor device comprised of basic cells having a bulk pattern which permits the construction of unit cells ranging over plural basic cell arrays.

It is another object of the present invention to provide a masterslice semiconductor device with which the occurrence of the redundant transistors in a unit cell is substantially eliminated.

The above objects can be accomplished by constituting a masterslice semiconductor device by incorporating additional p-channel and n-channel MIS (Metal Insulator Semiconductor) transistors into each basic cell comprised of at least one transistor pair having a p-channel MIS transistor and/or an n-channel MIS transistor. That is, the basic cell of the present invention fundamentally comprises a transistor pair including one each of first p-channel and first n-channel transistors and one each of second p-channel and n-channel transistors. The first p-channel and n-channel transistors are formed to be adjacent each other in the semiconductor substrate. The second p-channel transistor is formed at a place adjacent to one longitudinal end of the transistor pair in the semiconductor substrate, while the second n-channel transistor is formed at a place adjacent to the other longitudinal end of the transistor pair in the semiconductor substrate. The gates of said first p-channel and n-channel transistors are formed to extend in line with each other along the rows or columns of the semiconductor substrate, and the gates of said second p-channel and n-channel transistors are formed to extend along the columns of the semiconductor substrate.

The occurrence of the redundant transistors in the prior art masterslice semiconductor device are because each of the paired p-channel and n-channel transistors, $QP_1$ or $QN_1$, and $QP_2$ and $QN_2$ (see FIGS. 2 or 3), have a single common gate, however, the basic cell configuration in the present invention can substantially eliminate such redundant transistors, no matter whether the paired p-channel and n-channel transistors preserve the common gate or not.

Further modifications of the present invention will appear, together with other objects, features and advantages, more fully from the following preferred embodiments.

BRIEF DESCRIPTION OF THE DRAWINGS

FIG. 13 is an equivalent circuit diagram of a clocked gate;

FIG. 14 is a plan view illustrating an exemplary bulk pattern embodying the clock gate circuit shown in FIG. 13;

FIG. 16 is a plan view of a bulk pattern presenting still another embodiment of the present invention;

DESCRIPTION OF PREFERRED EMBODIMENTS

Figure 5:
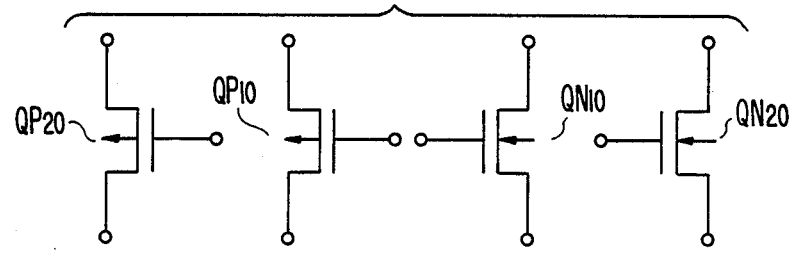
FIG. 5 is an equivalent circuit diagram showing the fundamental basic cell configuration according to the present invention.
Figure 6A:
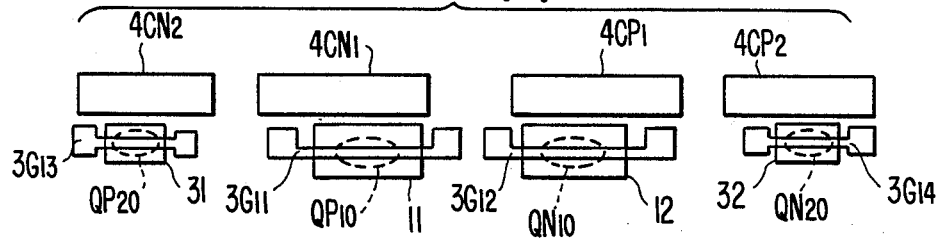
FIGS. 6(a) and 6(b) are plan views illustrating exemplary bulk patterns each embodying the circuit shown in FIG. 5.
Figure 6B:
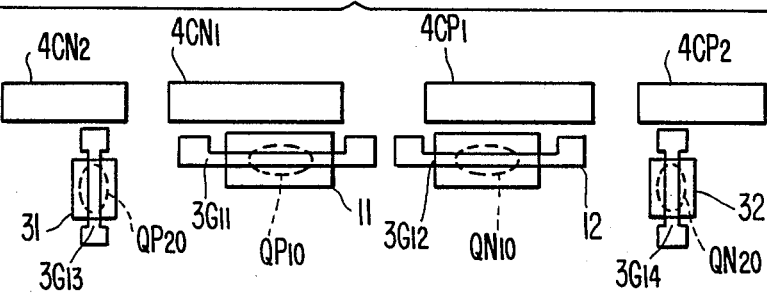

FIG. 5 is an equivalent circuit diagram showing the fundamental basic cell configuration according to the present invention, and FIGS. 6(a) and 6(b) are plan views illustrating exemplary bulk patterns each embodying the circuit shown in FIG. 5. In FIGS. 5, 6(a) and 6(b), the first p-channel transistor $QP_{10}$ and the first n-channel transistor $QN_{10}$, which are arranged adjacently to each other along rows of a semiconductor substrate, constitute a transistor pair. Referring to FIGS. 6(a) and 6(b), the respective gates of the first p-channel and n-channel transistors $QP_{10}$ and $QN_{10}$, extend in line with each other along the rows. At the position adjacent to one longitudinal end of the transistor pair, that is, comprising the first p-channel and n-channel transistors $QP_{10}$ and $QN_{10}$, an additional transistor, for example, a p-channel transistor $QP_{20}$, is formed, and at the position adjacent to the other longitudinal end of the transistor pair, another additional transistor having a channel of opposite conduction type to the former additional transistor, in other words, an n-channel transistor $QN_{20}$ in FIGS. 6(a) and 6(b), is formed.

In FIG. 6(a), the respective gates $3G_{13}$ and $3G_{14}$ of both additional transistors (referred to hereinafter as the second p-channel and n-channel transistors $QP_{20}$ and $QN_{20}$, are laid out in line with the extension of the respective gates $3G_{11}$ and $3G_{12}$ of the first p-channel transistor $QP_{10}$ and the first n-channel transistor $QN_{10}$. In FIG. 6(b), the respective gates $3G_{13}$ and $3G_{14}$ of the second p-channel transistor $QP_{20}$ and the second n-channel transistor $QN_{20}$ are laid out in parallel to each other and perpendicularly to the extension of the respective gates $3G_{11}$ and $3G_{12}$ of the first p-channel transistor $QP_1$ and the first n-channel transistors $QN_1$.

In both FIGS. 6(a) and 6(b), each of the reference numerals 11, and 31 designates the respective p-type region of the p-channel transistors $QP_{10}$ and $QP_{20}$, while each of the reference numerals 12 and 32 designates the respective n-type region of the n-channel transistors $QN_{10}$ and $QN_{20}$, and, further, each of the reference characters $4CP_1$ and $4CP_2$ denotes a p-type contact region and each of the reference characters $4CN_1$ and $4CN_2$ denotes an n-type contact region. The contact regions are used for keeping every portion of the semiconductor substrate at a respective specified potential, as mentioned before.

Figure 7:
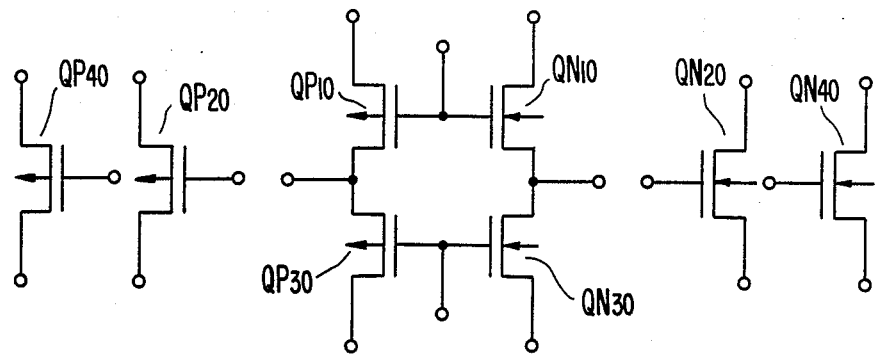
FIG. 7 is an equivalent circuit diagram of another basic cell according to the present invention.
Figure 8:
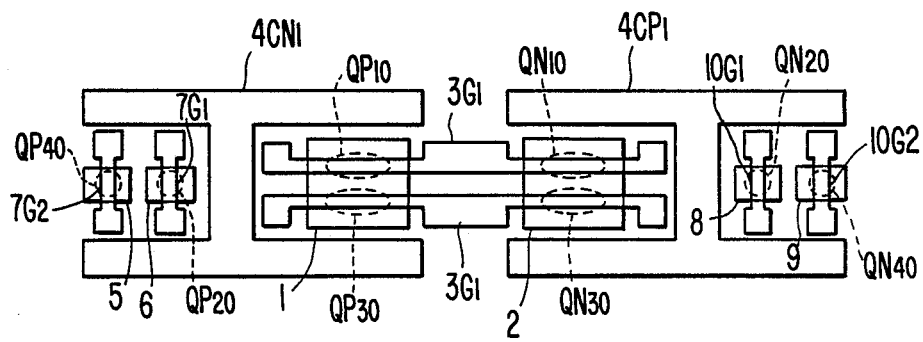
FIG. 8 is a plan view illustrating an exemplary bulk pattern embodying the circuit shown in FIG. 7.

FIG. 7 is an equivalent circuit diagram of another basic cell according to the present invention, and FIG. 8 is an exemplary bulk pattern embodying the circuit shown in FIG. 7. It may be considered, on comparing with FIGS. 5 and 6(b), that the basic cell shown in FIGS. 7 and 8 further includes another transistor pair comprising a third p-channel transistor $Q_{30}$ and a third n-channel transistor $QN_{30}$, and further additional transistors, i.e., a fourth p-channel transistor $QP_{40}$ and a fourth n-channel transistor $QN_{40}$. The first p-channel and n-channel transistors $QP_{10}$ and $QN_{10}$ have a single common gate $3G_1$, and the third p-channel and n-channel transistors $QP_{30}$ and $QN_{30}$ have another single common gate $3G_2$. The sources or drains of the first and the third p-channel transistors $QP_{10}$ and $QP_{30}$ form a single common source or drain in the p-type region 1, and the sources or drains of the first and the third n-channel transistors $QN_{10}$ and $QN_{30}$ form another single common source or drain in the n-type region 2.

Referring to FIG. 8, the pair of the third p-channel and n-channel transistors $QP_{30}$ and $QN_{30}$ are arranged in parallel to the first transistor pair comprising the first p-channel and n-channel transistors $QP_{10}$ and $QN_{10}$ and the gates of the third p-channel and n-channel transistors $QP_{30}$ and $QN_{30}$ are formed to extend in line with each other along the rows of the semiconductor substrate. The second p-channel and n-channel transistors $QP_{20}$ and $QN_{20}$ and the fourth p-channel and n-channel transistors $QP_{40}$ and $QN_{40}$ are arranged in a respective lines crossing the midline between the first transistor pair comprising the first p-channel and n-channel transistors $QP_{10}$ and $QN_{10}$ and the other transistor pair comprising the third p-channel and n-channel transistors $QP_{30}$ and $QN_{30}$. The respective gates $7G_1$ and $7G_2$ of the second and the fourth p-channel transistors $QP_{20}$ and $QP_{40}$ are formed to extend in parallel to each other along the columns of the semiconductor substrate, and the respective gates $10G_1$ and $10G_2$ of the second and the fourth n-channel transistors $QN_{20}$ and $QN_{40}$ are formed to extend in parallel to each other along the columns of the semiconductor substrate. The contact regions of the p-channel transistors $QP_{10}$, $QP_{20}$, $QP_{30}$ and $QP_{40}$ are united into a single common n-type contact region $4CN_1$, and those of the n-channel transistors $QN_{10}$, $QN_{20}$, $QN_{30}$ and $QN_{40}$ are united into a single common p-type contact region $4CP_1$. In FIG. 8, the reference numerals 5 and 6 denote p-type regions for the p-channel transistor $QP_{20}$ and $QP_{40}$, respectively, and the reference numerals 8 and 9 denote n-type regions for the n-channel transistors $QN_{20}$ and $QN_{40}$, respectively. In each respective region, the sources and drains of the transistors $QP_{20}$, $QP_{40}$, $QN_{20}$ and $QN_{40}$ are formed.

Figure 1:
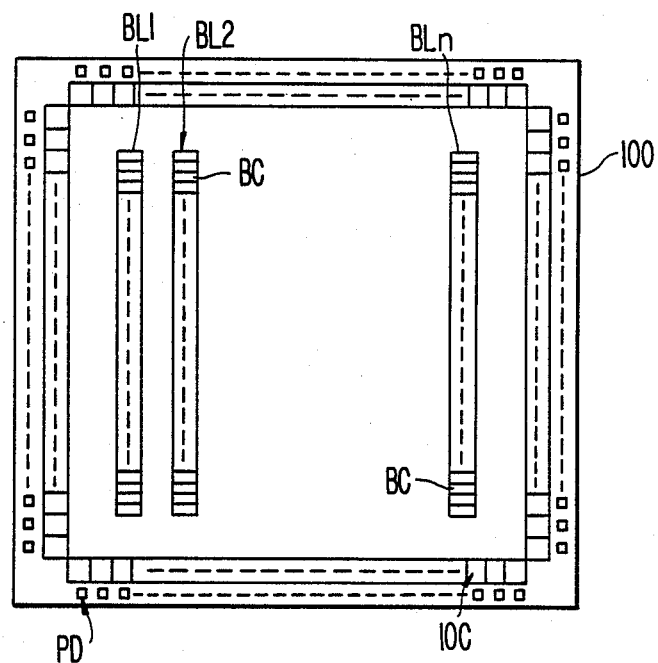
FIG. 1 is a plan view showing an exemplary bulk pattern of a conventional gate array formed by use of masterslice technology.
Figure 2:
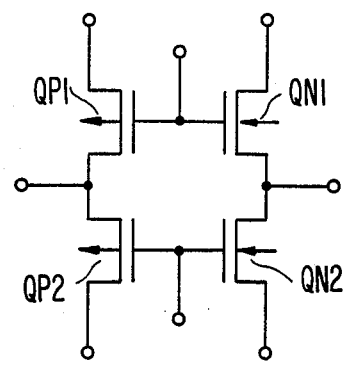
FIG. 2 is an equivalent circuit diagram exemplifying the circuit included in a single basic cell of a prior art masterslice semiconductor device.
Figure 3:
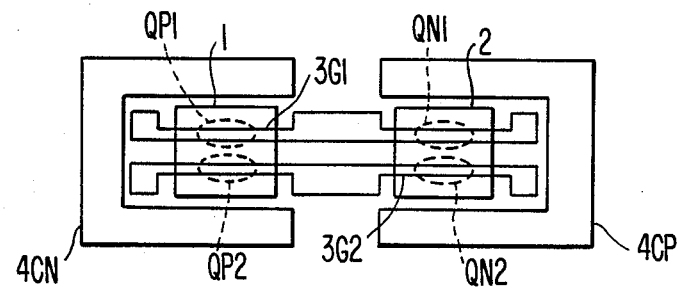
FIG. 3 is a plan view illustrating an exemplary bulk pattern of a basic cell for embodying the circuit as shown in FIG. 2.
Figure 4:
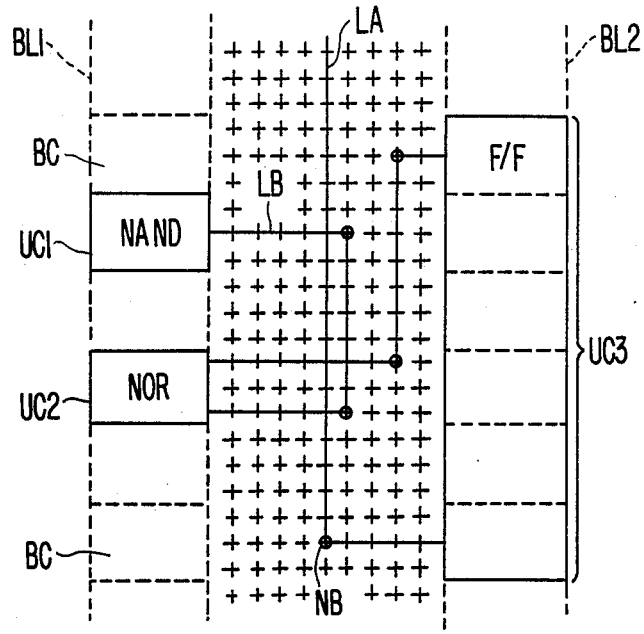
FIG. 4 is a partial plan view illustrating the layout of unit cells in the two adjacent basic cell arrays and the layout of wiring lines for interconnecting the unit cells.

As is obvious in FIG. 8, the basic cell partially comprises the same bulk pattern as that of the prior art as shown in FIG. 3.

Figure 9:
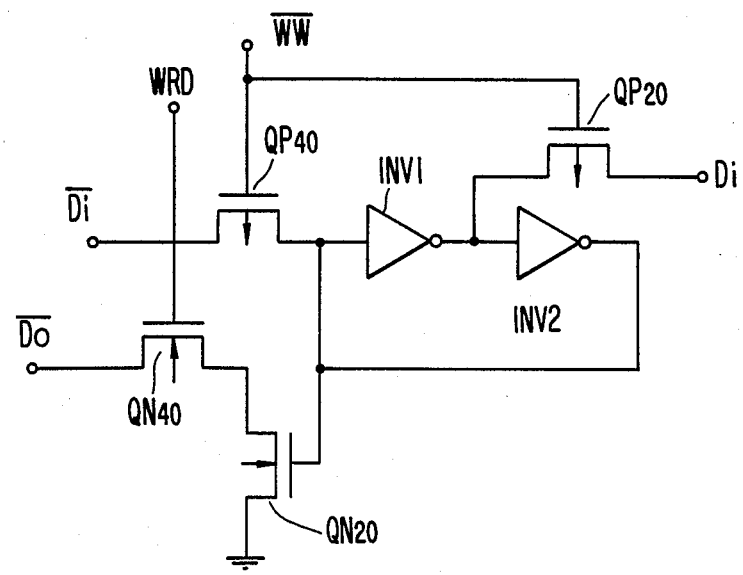
FIG. 9 is an equivalent circuit diagram of a RAM cell.
Figure 10:
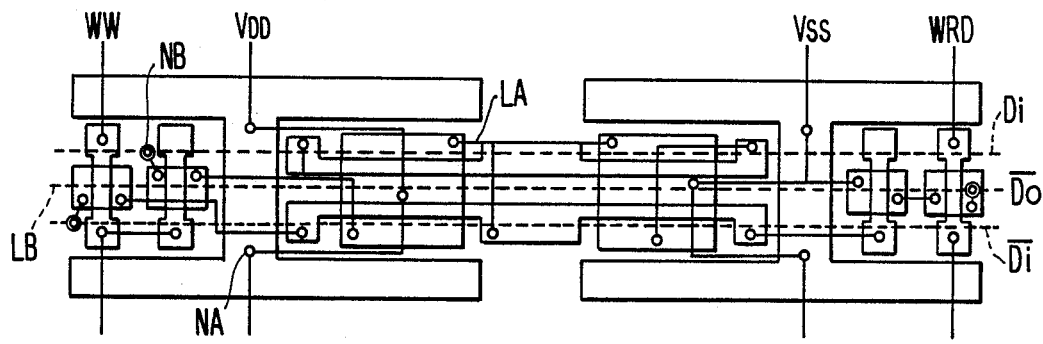
FIG. 10 is a plan view illustrating an exemplary distribution of wiring lines, embodying the RAM cell by using the basic cell shown in FIG. 8.

FIG. 9 is an equivalent circuit diagram of a RAM cell and FIG. 10 is a plan view illustrating an exemplary distribution of wiring lines for embodying the RAM cell by using the basic cell shown in FIG. 8. The inverters $INV_1$ and $INV_2$ in FIG. 9, are respectively formed of the transistor pair comprising the p-channel transistors $QP_{10}$ and n-channel transistor $QN_1$, and another transistor pair comprising the p-channel transistor $QP_{30}$ and n-channel transistor $QN_{30}$ as in FIG. 8. In FIGS. 9 and 10, reference characters WRD and $\overline{WW}$ designate a read-out word line and a write-in word line, respectively. The input data signals and the inversed input data signals are supplied to the terminals denoted by reference characters Di and $\overline{Di}$ respectively, and inverted output data signals are output from the terminal denoted by reference character $\overline{Do}$. In FIG. 10, LA indicates the wiring lines (thick solid lines) fabricated from the first layer in the double-layer aluminum metallization, and LB indicates the wiring lines (thick broken lines) fabricated from the second layer in the double-layer aluminum metallization. The wiring lines LA and LB have contacts, at the specified portions on the surface, with the semiconductor substrate, wherein each of the portions is indicated by small circles. The wiring lines LA and LB are connected with each other via through-holes formed in the insulating layer therebetween at specified cross-over points indicated by the doubled circles. In FIG. 10, $V_{DD}$ and $V_{SS}$ designate positive potential source and negative potential (usually earth potential) source.

As described above, the RAM cell shown in FIG. 9 can be fabricated by use of one basic cell of the present invention, although the area occupied by the basic cell of the present invention is larger than that of the prior art basic cell as shown in FIG. 3 by the increment of the respective second and fourth p-channel and n-channel transistors. Even assuming the basic cell of the present invention occupies about twice the area of the prior art, the area necessary to form the RAM cell is one half of the total areas occupied by the four prior art basic cells necessary for constituting an equivalent RAM cell.

Figure 11:
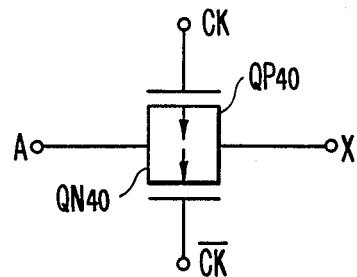
FIG. 11 is an equivalent circuit diagram of a transmission gate.
Figure 12:
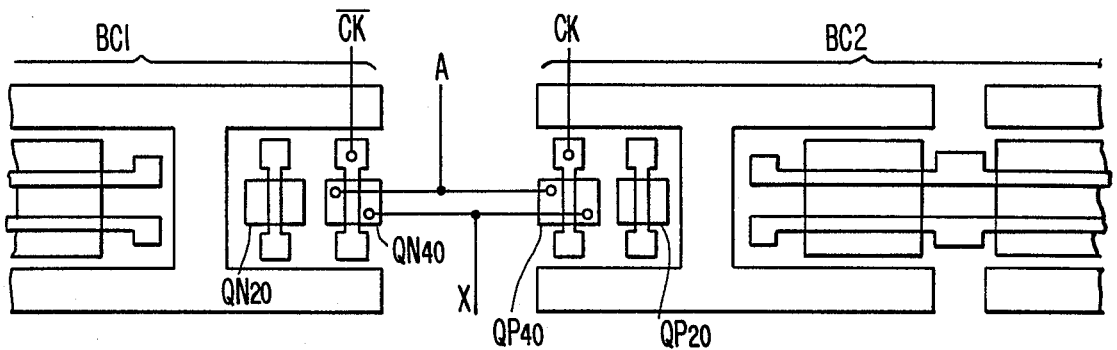
FIG. 12 is a plan view illustrating an exemplary bulk pattern embodying the circuit of the transmission gate shown in FIG. 11.

FIG. 11 is an equivalent circuit diagram of a transmission gate, and FIG. 12 is a plan view illustrating an exemplary bulk pattern embodying the circuit of the transmission gate shown in FIG. 11. In FIGS. 11 and 12, input signals, clock signals and inverted clock signals are supplied to the respective terminals denoted by the reference characters A, CK and $\overline{Ck}$, and the output signal is output from the terminal denoted by reference character X. As shown in FIG. 12, the transmission gate can be comprised of the fourth p-channel transistor $QP_{40}$ in the basic cell $BC_2$ and the fourth n-channel transistor $QN_{40}$ in the basic cell $BC_1$. The basic cell $BC_1$ and basic cell $BC_2$ belong to two respective adjacent basic cell arrays, but have the same bulk pattern as shown in FIG. 8. The remainder transistors in each of the basic cells $BC_1$ and $BC_2$ can be utilized to constitute another unit cell, that is, an elemental circuit, which usually functions in cooperation with the transmission gate. If the respective transistors $QP_{20}$ and $QN_{20}$ in the basic cell $BC_1$ and $BC_2$ are not used, the area occupied by these transistors can naturally be utilized for the wiring region. Thus, a transmission gate can be formed without the occurrence of any redundant transistors.

As explained above, the transmission gate, as a unit cell, can be organized by use of basic cells belonging to two adjacent basic cell arrays, in other words, a unit cell can be two-dimensional in terms of the arrangement of basic cells. This feature is provided by the novel configuration of the basic cell of the present invention. That is, in the basic cell of the present invention, the additional transistors (the respective second and fourth transistors) at each longitudinal end of the transistor pairs are formed to occupy the part of the space which is, in the prior art, exclusively used for distributing wiring lines between each pair of adjacent basic cell arrays. Hence, interconnection of the basic cells belonging to adjacent basic cell arrays can be accomplished more easily thanks to the additional transistors in the basic cells and the shorter wiring lines. The additional transistors functionally constitute a unit cell ranging over the adjacent basic cell arrays. Further, the versatility of the additional transistors, each of which has an individual gate and which occupies respective individual source and drain regions, increases the freedom in designing a unit cell.

FIG. 13 is an equivalent circuit diagram of a clocked gate, and FIG. 14 is a plan view illustrating an exemplary bulk pattern embodying the circuit of the clocked gate shown in FIG. 13, by using the basic cells of the present invention. The clocked gate shown in FIG. 13 comprises two p-channel transistors and two n-channel transistors connected in series between a positive potential source $V_{DD}$ and a negative potential source $V_{SS}$. Referring to FIG. 14, for these transistors, the second and fourth p-channel transistors $QP_{20}$ and $QP_{40}$ in the basic cell $BC_1$ and the second and fourth n-channel transistors $QN_{20}$ and $QN_{40}$ in the basic cell $BC_2$ are employed. The remainder transistors in each of the basic cells $BC_1$ and $BC_2$ can be utilized for constituting another unit cell. Therefore, no redundant transistors result, as compared with the prior art masterslice semiconductor device wherein two basic cells as shown in FIG. 3 are required to constitute such equivalent clocked gate, wherein four redundant transistor occur as mentioned before.

Other circuits of unit cells including a 2-input NAND gate, inverter circuits, etc. can be organized by use of the additional transistors in the basic cell of the present invention. If these additional transistors are not utilized for constituting a unit cell, the region occupied by the additional transistors can be used exclusively for distributing the wiring lines, as in the wiring region in the prior art masterslice semiconductor device.

Figure 15:
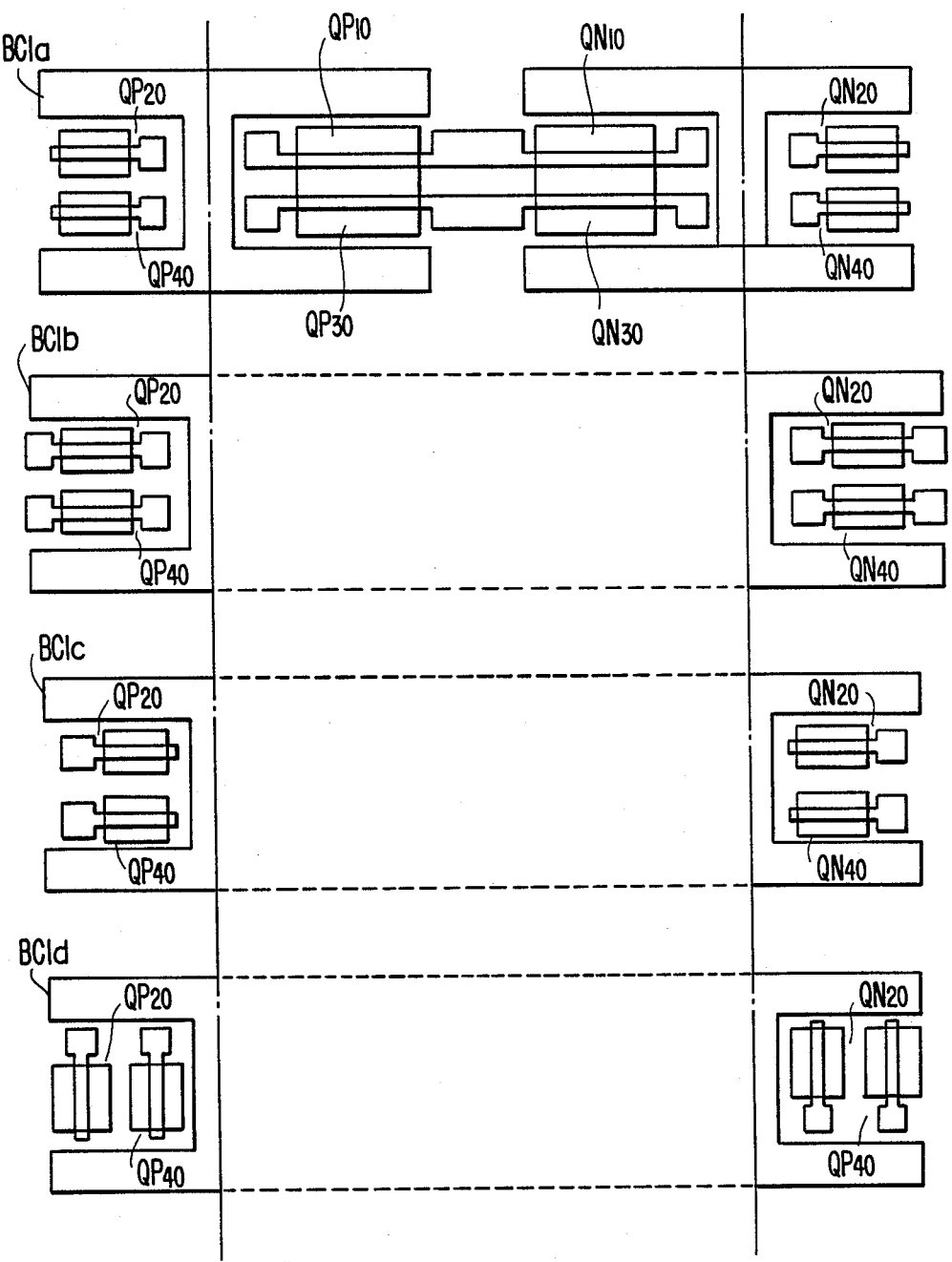
FIG. 15 is a plan view of a bulk pattern presenting another embodiment of the present invention.

FIG. 15 is a plan view of a bulk pattern presenting a further embodiment of the present invention. Referring to FIG. 15, a basic cell array comprises four kinds of basic cells, $BC_{1a}$, $BC_{1b}$, $BC_{1c}$ and $BC_{1d}$, each having a configuration according to the present invention. However, in basic cells $BC_{1a}$, $BC_{1b}$ and $BC_{1c}$, each arrangement of the additional transistors $QP_{20}$ and $QN_{20}$ with respect to the transistor pair comprising transistors $QP_{10}$ and $QN_{10}$, and that of the additional transistors, $QP_{40}$ and $QN_{40}$ with respect to the transistor pair comprising transistors $QP_{30}$ and $QN_{30}$, is the same as shown in FIG. 6(a), and the gates of the additional transistors $QP_{20}$ and $QN_{20}$ are formed to extend in line with the extension of the gate of the transistor pair comprising transistors QP$_{10}$ and QN$_{10}$, and the gate of the additional transistors, QP$_{40}$ and QN$_{40}$ are formed to extend in line with the extension of the gate of the transistor pair comprising transistors QP$_{30}$ and QN$_{30}$. The gates of the additional transistors QP$_{20}$ and QP$_{40}$ are in parallel to each other, and the gates of the additional transistors QN$_{20}$ and QN$_{40}$ are in parallel to each other. However, the basic cell BC$_{1d}$, the arrangement of the additional transistors QP$_{20}$, QN$_{20}$, QP$_{40}$ and QN$_{40}$ with respect to the other two transistor pairs are the same that shown in FIG. 8. The difference among the basic cells BC$_{1a}$, BC$_{1b}$ and BC$_{1c}$ is observed to be in the shape of the gate electrodes including being of three types, as is obvious in FIG. 15. The one or two tubs at each gate electrode are used as contact terminals for the wiring. In the basic cells BC$_{1a}$, BC$_{1c}$ and BC$_{1d}$, single-tub gates are used for the additional transistors QP$_{20}$, QP$_{40}$, QN$_{20}$ and QN$_{40}$, while for the additional transistors in the basic cell BC$_{1b}$, used are two-tub gates. Moreover, the location of the single-tub gates in each basic cell are different from other, as shown in FIG. 15.

FIG. 16 is a plan view of a bulk pattern presenting still another embodiment of the present invention. In FIG. 16, each of the basic cells BC$_{11}$ and BC$_{12}$, which belong to the same basic cell array, has the same configuration as the basic cell shown in FIG. 8. However, the respective fourth p-channel transistors QP$_{40}$ in the basic cells BC$_{11}$ and BC$_{12}$ have a single common gate, and also the respective n-channel transistors QN$_{40}$ in the basic cells BC$_{11}$ and BC$_{12}$ have another single common gate. Therefore, the contact regions 4CN$_1$ and 4CP$_1$ are not extended to the portions between these additional transistors. It is natural for such a common gate to be provided for the additional transistor QP$_{40}$ or QN$_{40}$ in every two basic cells successively arranged in a basic cell array, and to not be provided, for example, for the respective fourth p-channel transistor QP$_{40}$ in the basic cell BC$_{12}$ in the next basic cell (not shown). The advantage of the bulk pattern as shown in FIG. 16 is explained in the following.

Figure 17:
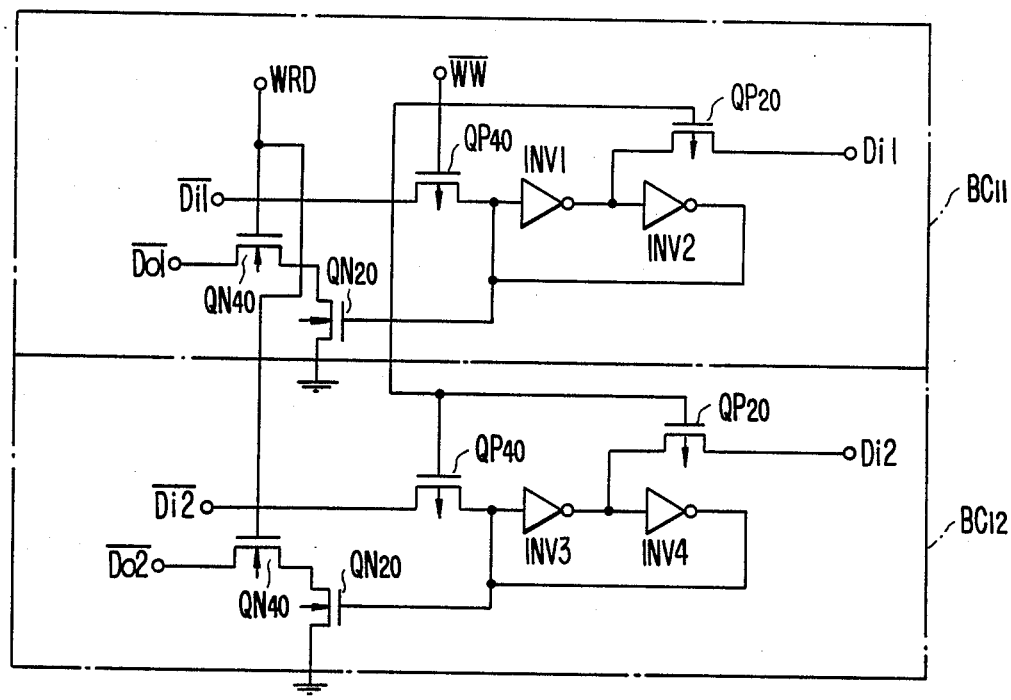
FIG. 17 is an equivalent circuit diagram of a couple of RAM cells.
Figure 18:
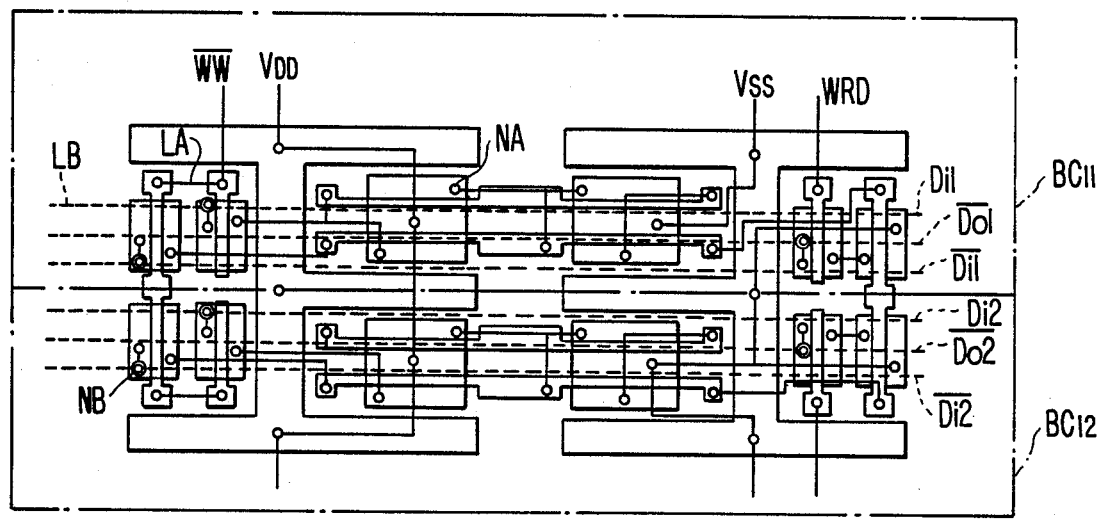
FIG. 18 is a plan view of an exemplary bulk pattern embodying the circuit of the RAM cells shown in FIG. 17.

FIG. 17 is an equivalent circuit diagram of two RAM cells, and FIG. 18 is a plan view of an exemplary bulk pattern embodying the circuit of RAM cells shown in FIG. 17. In FIGS. 17 and 18, reference characters WRD, $\overline{WW}$, INV$_1$ and INV$_2$ are used with the same respective meanings as in FIGS. 9 and 10. The reference characters Di$_1$ and Di$_2$ designate the terminals for input data signals Di$_1$ and Di$_2$, respectively, the reference characters $\overline{Di_1}$ and $\overline{Di_2}$ designate the terminals for inverted input data signals $\overline{Di_1}$ and $\overline{Di_2}$, respectively, $\overline{Do_1}$ and $\overline{Do_2}$ designate the terminals for inverted output data signals, respectively, and INV$_3$ and INV$_4$ denote inverter circuits. In FIGS. 17 and 18, the inverter circuits INV$_1$ and INV$_2$ are formed from the aforesaid transistor pairs in the basic cell BC$_{11}$, and the inverter circuits INV$_3$ and INV$_4$ are formed from the aforesaid transistor pairs in the basic cell BC$_{12}$, according to the same manner as in the embodiment explained by FIGS. 9 and 10. In FIG. 18, reference characters LA and LB designate the first wiring layer (indicated by thick solid lines) and the second wiring layer (indicated by thick dotted lines), respectively, wherein both wiring layer are fabricated by use of double-layer aluminum metallization technology. The reference character NA denotes the contact portions (each indicated by a small circle) of the first aluminum wiring layer and the semiconductor substrate, and the reference character NB denotes the contact portions (each indicated by a doubled-circle) of the first aluminum wiring layer and the second aluminum wiring layer.

If the pair of the basic cells BC$_{11}$ and BC$_{12}$ is assumed to be a single basic cell, the bulk pattern can constitute two bits of a RAM cell without the occurrence of any redundant transistors and the need of aluminum wirings for the interconnection between the fourth p-channel transistors QP$_{40}$ and the interconnection between the fourth n-channel transistors QN$_{40}$. Therefore, the masterslice comprised of such basic cells is highly suitable to the manufacturing of custom RAMs.

Figure 19:
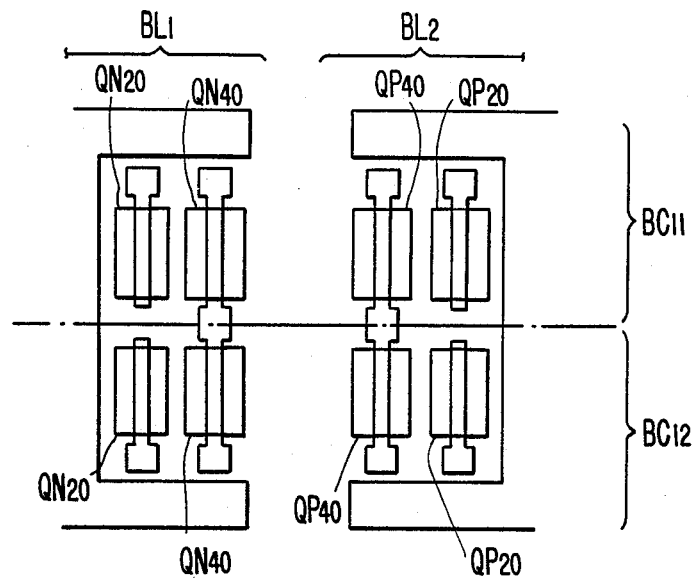
FIG. 19 is a plan view of a partial bulk pattern illustrating the additional transistors in two adjacent basic cell arrays.

FIG. 19 is a plan view of a partial bulk pattern illustrating the fourth transistors in two adjacent basic cell arrays. Referring to FIG. 19, the respective second and fourth p-channel transistors QP$_{20}$ and QP$_{40}$ in the basic cells BC$_{11}$ and BC$_{12}$, both of which belong to the basic cell array BL$_2$, can be assumed to be a basic cell having a configuration similar to the prior art basic cell as shown in FIG. 3. This is quite the same as for the second and fourth n-channel transistors QN$_{20}$ and QN$_{40}$ in the basic cells BC$_{11}$ and BC$_{12}$, both of which belong to the basic cell array BL$_1$. A different from the prior art basic cell is that the newly introduced basic cell comprises the transistors having channels of the same conduction type, and, in the basic cell, only one transistor pair is provided with a common gate, and none of the transistors shares a common source or drain with the others.

Figure 20:
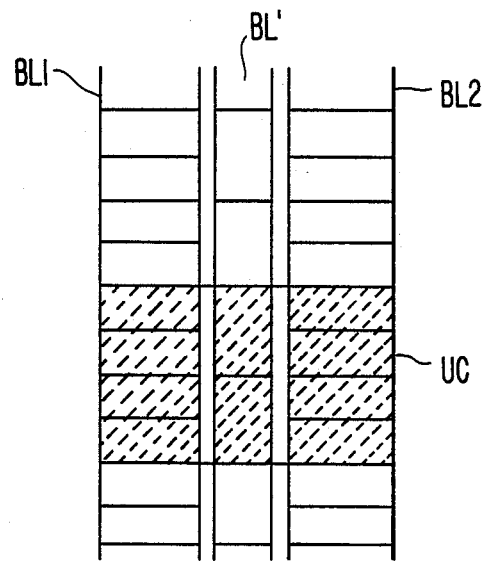
FIG. 20 is a plan view of a conceptual bulk pattern for explaining the concept of a new basic cell array comprising the additional transistors.

The concept of the new basic cell suggests the existence of a new basic cell array BL' between the basic cell arrays BL$_1$ and BL$_2$, as shown in FIG. 20, which illustrates a plan view of a conceptual bulk pattern presenting the new basic cell array. In FIG. 20, the basic cell array BL' comprises two kinds of the newly introduced basic cells, as explained above with reference to FIG. 19. The bulk pattern in FIG. 20 can, in one view, be considered as a new basic cell array inserted between two adjacent basic cell arrays comprising the prior art basic cells as shown in FIG. 3.

The many features and advantages of the present invention are apparent from the detailed description, but it will be recognized by those skilled in the art that modifications and variations may be affected within the spirit and scoipe of the present invention. For example, the entire region occupied by the additional transistors in any basic cell array can be used for the wiring region as in the prior art. Furthermore, along rows, the arrangement of the p-channel and n-channel transistors constituting the transistor pair in any basic cell of the present invention may be optional among basic cell arrays, and the arrangement of the additional p-channel and n-channel transistors with respect to the transistor pair or pairs may also be optional, provided that the regularity of the arrangements is kept within each basic cell array. For instance, in a basic cell array, all of the p-channel transistors occupy the left-hand side positions against n-channel transistors, while, in any of the other basic cell arrays, vice versa.

I claim:

1. A masterslice semiconductor device having a large number of basic cells formed on a semiconductor substrate, the basic cells being arranged along rows and columns and constituting a plurality of basic cell arrays, each one of said basic cell arrays being aligned along a respective one of said columns, wherein each said basic cell comprises:

a first transistor pair, including a first p-channel transistor and a first n-channel transistor formed adjacent each other with respective sources, gates and drains, the gates of said first p-channel and n-channel transistors extending in a direction parallel to a respective row and transverse to the direction of current between the respective sources and drains of said first p-channel and n-channel transistors, said first transistor pair defining first and second longitudinal sides in the direction of the extension of the respective gates of the first p-channel and n-channel transistors;

a second p-channel transistor formed adjacent said first longitudinal side of said first transistor pair;

a second n-channel transistor formed adjacent said second longitudinal side of said first transistor pair, said second p-channel and n-channel transistors having gates extending transversely to the direction of current between respective sources and drains thereof, the gates being respectively aligned perpendicular to said extension of the gates of said first p-channel and n-channel transistors;

interconnecting lines for connecting between said basic cells, each pair of adjacent ones of said basic cell arrays being spaced in a direction along the rows by a region for distributing at least a pair of said interconnecting lines therebetween.

2. A masterslice semiconductor device as set forth in claim 1, wherein in respective ones of said basic cells each of the gates of said second p-channel and n-channel transistors, extending transversely to the direction of current between the respective source and drain of each said second transistor, a source and a drain of each said second transistor, are formed to extend in parallel with the respective extension of the gates of said first p-channel and n-channel transistors of the same basic cell.

3. A masterslice semiconductor device as set forth in claim 1, wherein in each said basic cell the gates of said first p-channel and n-channel transistors are commonly connected to each other by the same electrode material extending along the respective extension of the gates.

4. A masterslice semiconductor device as set forth in claim 2, wherein respective ones of said basic cells comprise:

a second transistor pair including a third p-channel transistor and a third n-channel transistor, respectively aligned in parallel and adjacent to said first p-channel and n-channel transistors, commonly defining said first and second longitudinal sides of said first trnsistor pair, wherein the gates of said third p-channel and n-channel transistors are formed extending in a direction parallel to the rows;

a fourth p-channel transistor formed adjacent to said first longitudinal side of said first and third transistors; and a fourth n-channel transistor formed adjacent to the second longitudinal side of said first and third transistors;

wherein said fourth p-channel and n-channel transistors are respectively aligned in parallel and adjacent to said second p-channel and n-channel transistors, and portions of the gates of said fourth p-channel and n-channel transistors, extending in a direction transverse to a direction of current between a source and a drain of said fourth p-channel and n-channel transistors, are formed extending in perpendicular to the respective extension of said gates of said third p-channel and n-channel transistors of said basic cell.

5. A masterslice semiconductor device as set forth in claim 4, wherein in respective ones of said basic cells the gates of said third p-channel and n-channel transistors are commonly connected to each other by the same electrode material.

6. A masterslice semiconductor device as set forth in claim 4, said basic cells comprising p-type and n-type regions, wherein one source nd one drain of said first and third p-channel transistors are formed in common by one of said p-type regions and one each of the sources and drains of said first and third n-channel transistors are formed in common by one of said n-type regions.

7. A masterslice semiconductor device as set forth in claim 1, wherein in respective ones of said basic cells the gates of said first p-channel and n-channel transistors are commonly connected to each other by the same electrode material.

8. A masterslice semiconductor device as set forth in claim 1, wherein respective ones of said basic cells comprise:

a second trnsistor pair including a third p-channel transistor and a third n-channel transistor, respectively aligned in parallel and adjacent to said first p-channel and n-channel transistors, wherein the gates of said third p-channel and n-channel transistors, extending transversely to the direction of current between the respective sources nd drains of sid third p-channel and n-channel transistors, are formed extending in a direction parallel to said extension of the gates of said first p-channel and n-channel transistors;

a fourth p-channel transistor formed adjacent one longitudinal side of said second transistor pair; and a fourth n-channel transistor formed adjacent the other longitudinal side of said second transistor pair;

wherein said fourth p-channel and n-channel transistors are respectively aligned in parallel and adjacent to said second p-channel and n-channel transistors, and the gates of said fourth p-channel and n-channel transistors, extending transversely to the direction of current between the sources and drains of said fourth p-channel and n-channel transistors, extend perpendicularly to said extension of the gates of said third p-channel and n-channel transistors.

9. A masterslice semiconductor device as set forth in claim 4, wherein in respective ones of said basic cells said second and fouth p-channel and n-channel transistors are formed to be situated on lines parallel to said rows.

10. A masterslice semiconductor device as set forth in claim 8, wherein in respective ones of said basic cells all of said second p-channel and n-channel transistors and said fourth p-channel and n-channel transistors are formed to be situated on respective common lines perpendicular to said rows.

11. A masterslice semiconductor device as set forth in claim 10, wherein in respective ones of said basic cells sid second p-channel and n-channel transistors and said fourth p-channel and n-channel transistors are formed to be situated on said respective common lines symmetrically with respect to a line midway between said first transistor pair and said second transistor pair.

12. A masterslice semiconductor device as set forth in claim 8, wherein in respective ones of said basic cells the gates of said third p-channel and n-channel transistors are commonly connected to each other by the same electrode material.

13. A masterslice semiconductor device as set forth in claim 8, wherein respective ones of said basic cells comprise a p-type region in which two predetermined ones of the sources and drains of said first and third p-channel transistors are formed, and a n-type region in which two predetermined ones of the source and drains of said first and third n-channel transistors are formed.

14. A masterslice semiconductor device as set forth in claim 8, wherein in respective ones of said basic cells the gates of said fourth p-channel transistors in every two adjacent basic cells are commonly connected to each other by the samd electrode material, and the gates of said fourth n-channel transistors in the same two adjacent basic cells are commonly connected to each other by the same electrode material.

15. A masterslice semiconductor device as set forth in claim 8, wherein respective ones of said basic cells comprise:
- a first n+ region formed in the semiconductor substrate adjacent to a respective side of each of said first and third p-channel transistor;
- a second n+ region formed in the semiconductor substrate adjacent to a respective side of each of said second and fourth p-channel transistors;
- a first p+ region formed in the semiconductor substrate adjacent to a respective side of each of said first and third n-channel transistors; and
- a second p+ region formed in the semiconductor substrate adjacent to a respective side of each of said second and fourth n-channel transistors;
- wherein said n+ and p+ regions are for supplying respective portions of the semiconductor substrate with respective potentials.

16. A masterslice semiconductor device as set forth in claim 7, respective ones of said basic cells each comprising:
- an n+ region formed in the semiconductor substrate so as to separate said second p-channel transistor from said first longitudinal end of said transistor pair; and
- a p+ region formed in the semiconductor substrate so as to separate said second n-channel transistor from said second longitudinal end of said transistor pair;
- wherein said n+ and p+ regions are for supplying respective portions of the semiconductor substrate with each respective potentials.

17. A masterslice semiconductor device as set forth in claim 4, respective ones of said basic cells each comprising:
- an n+ region formed in the semiconductor substrate so as to separate said second p-channel transistor from the respective longitudinal end of each said transistor pair; and
- a p+ region formed in the semiconductor substrate so as to separate said second n-channel transistor from the respective longitudinal end of each said transistor pair;
- wherein said n+ and + regions are for supplying respective portions of the semiconductor substrate with respective potentials.

18. The device of claim 1, comprising interconnecting lines for connecting between said basic cells, wherein said interconnecting lines extend over predetermined ones of said basic cells to connect between others of said basic cells.

19. The device of claim 1, comprising interconnecting lines extending in the direction of said rows and columns for selectively forming two-dimensional unit cells from respective ones of said basic cells.

20. A masterslice semiconductor device as set forth in claim 1, wherein each of said basic cells comprises:
- an n+-type region formed in the semiconductor substrate adjacent to said first and second p-channel transistors; and
- a p+-type region formed in the semiconductor substrate adjacent to said first and second n-channel transistors, said n+ and p+-type regions supplying respective portions of the semiconductor substrate with a respective potential.

21. A masterslice semiconductor device as set forth in claim 8, wherein respective ones of said basic cells comprise:
- second pairs of said first, second, third and fourth transistors, respectively aligned with respect to each other and adjacent ones of the first pairs thereof;
- wherein an n+ region is provided for separating said second and fourth p-channel transistors from said first and third p-channel transistors and one adjacent respective side of each of said first to fourth p-channel transistors; and
- a p+ region is provided separating said second and fourth n-channel transistors from said first and third n-channel transistors and one adjacent respective side of each of said first to fourth n-channel transistors;
- wherein said second and fourth transistors are aligned and have gates extending perpendicularly to the common direction of extension of the gates of said first and third transistors;
- wherein each of said second and fourth transistors have a doped region; and
- wherein the gates of selected adjacent pairs of said second and fourth transistors are commonly connected.

22. The device of claim 21, each said n+ and p+ region extending to separate the respective pair of said first and third transistors from the respective further pairs thereof.

23. The device of claim 20, comprising
- said n+ region in each said respective basic cell extending between the first and second p-channel transistors, and
- said p+ region in each said respective basic cell extending between the first and second n-channel transistors.

24. The device of claim 23, wherein each of said n+ and p+ regions has the shape of one of the letters E and H.

25. The device of claim 23, wherein each said n+ and p+ region has the shape of the letter E combined back-to-back with the letter C.

26. The device of claim 23, wherein the respective ones of said transistors adjacent said n+ region are the respective p-channel transistors of said first and second transistors, and the respective ones of said transistors adjacent said p+ region are the respective n-channel transistors of said first and second transistors.

* * * * *

UNITED STATES PATENT AND TRADEMARK OFFICE
CERTIFICATE OF CORRECTION

PATENT NO. : 4,816,887
DATED      : MARCH 28, 1989
INVENTOR(S) : SHINJI SATO

It is certified that error appears in the above-identified patent and that said Letters Patent is hereby corrected as shown below:

FRONT PAGE [57] "ORTHAGONAL" should be --ORTHOGONAL--.

Col. 10, line 44, "SCOIPE" should be --SCOPE--.

Col. 11, line 50, "trnsistor" should be --transistor--.

Col. 12, line 10, "nd" should be --and--;
      line 24, "trnsistor" should be --transistor--;
      line 31, "nd" should be --and--;
      line 32, "sid" should be --said--;
      line 64, "sid" should be --said--.

Col. 13, line 17, "samd" should be --same--.

Signed and Sealed this

Nineteenth Day of September, 1989

Attest:

DONALD J. QUIGG

*Attesting Officer*   *Commissioner of Patents and Trademarks*